(12) United States Patent
Goto et al.

(10) Patent No.: US 6,545,457 B2
(45) Date of Patent: Apr. 8, 2003

(54) CURRENT DETECTOR UTILIZING HALL EFFECT

(75) Inventors: Hirokazu Goto, Tokyo (JP); Koji Ohtsuka, Kawagoe (JP); Takasi Kato, Asaka (JP); Hiromichi Kumakura, Ooimachi (JP)

(73) Assignee: Sanken Electric Co., Ltd. (JP)

( * ) Notice: Subject to any disclaimer, the term of this patent is extended or adjusted under 35 U.S.C. 154(b) by 0 days.

(21) Appl. No.: 09/893,937

(22) Filed: Jun. 29, 2001

(65) Prior Publication Data
US 2002/0011841 A1 Jan. 31, 2002

(30) Foreign Application Priority Data
Jul. 7, 2000 (JP) ........................................ 2000-206403

(51) Int. Cl.[7] .................. G01R 15/20; G01R 33/06; G01R 19/00; H01L 43/06
(52) U.S. Cl. .................. 324/117 H; 324/251; 338/32 H

(58) Field of Search .................. 324/251, 235, 324/207.2, 117 H; 338/32 H; 360/112; 257/422

(56) References Cited

U.S. PATENT DOCUMENTS 5,883,567 A * 3/1999 Mullins, Jr. ............... 338/32 H

FOREIGN PATENT DOCUMENTS

JP 2000-174357 A 6/2000

* cited by examiner

Primary Examiner—Walter E. Snow
(74) Attorney, Agent, or Firm—Woodcock Washburn LLP

(57) ABSTRACT

A Hall-effect semiconductor device is formed on a metal-made baseplate, as of nickel-plated copper, via a magnetic layer of Permalloy or the like. Higher in magnetic permeability than the baseplate, the magnetic layer is designed to reduce the magnetic resistance of the flux path. A plastic encapsulation thoroughly encloses the semiconductor device, magnetic layer, and baseplate.

6 Claims, 3 Drawing Sheets

CURRENT DETECTOR UTILIZING HALL EFFECT

BACKGROUND OF THE INVENTION

This invention relates to a magnetoelectric converter, sometimes referred to as a Hall generator, utilizing the familiar Hall effect for providing an output voltage proportional to the strength of the magnetic field applied.

The Hall generator has been known and used extensively which gives a voltage, known as Hall voltage, in proportion to magnetic field strength. The Hall generator therefore lends itself to use as a magnetism detector. Additionally, positioned contiguous to a path of electric current, the Hall generator will be acted upon by the magnetic field appearing in proportion to the magnitude of the electric current flowing through the path, thereby putting out a voltage proportional to the field strength and hence to the current magnitude.

As heretofore constructed, however, such Hall-effect devices have still left much to be desired. There have been consistent demands for devices of improved sensitivity to magnetic fields, and of improved noise immunity, in addition, of course, to those devices that meet all these requirements but that are nevertheless inexpensive.

SUMMARY OF THE INVENTION

The present invention aims at improving the noted important attributes of Hall-effect magnetoelectric converters.

Briefly, the invention may be summarized as a magnetoelectric converter utilizing the Hall-effect for detecting a magnetic field or electric current. Included is a magnetic layer formed on a metal-made baseplate, the magnetic layer being higher in magnetic permeability than the base-plate. Semiconductor means including a Hall-effect device for generating a voltage proportional to the strength of an applied magnetic field, are formed on the baseplate, either directly or via the magnetic layer. An encapsulation of electrically insulating material envelops the baseplate and the magnetic layer and the semiconductor means.

In one embodiment of the invention the magnetic layer is formed on one of the pair of opposite major surfaces of the baseplate, and the semiconductor means are formed on the baseplate via the magnetic layer. Alternatively, however, the semiconductor means may be formed directly on the other surface of the baseplate. As an additional alternative, a pair of magnetic layers may be formed on both major surfaces of the baseplate.

For the best results the baseplate may be fabricated from copper, with or without nickel plating, and the magnetic layer from Permalloy.

The provision of the magnetic layer or layers on the metal-made baseplate according to the invention has proved to reduce the magnetic resistance of the flux path. The Hall-effect device is thus rendered more sensitive to the magnetic field, developing a voltage in exact proportion to the field strength.

The metal-made baseplate with the magnetic layer or layers thereon has also proved to serve the additional purpose of effectively shielding the Hall-effect device from external magnetic or electromagnetic noise. The baseplate will absorb high-frequency noise as eddy current flows therein, whereas the magnetic layer or layers will provide a bypass or bypasses for lower-frequency noise. Hence the improved noise immunity of the device.

The above and other objects, features and advantages of this invention will become more apparent, and the invention itself will best be understood, from a study of the following detailed description and appended claims, with reference had to the attached drawings showing the preferred embodiments of the invention.

DESCRIPTION OF THE PREFERRED EMBODIMENTS

Figure 1:
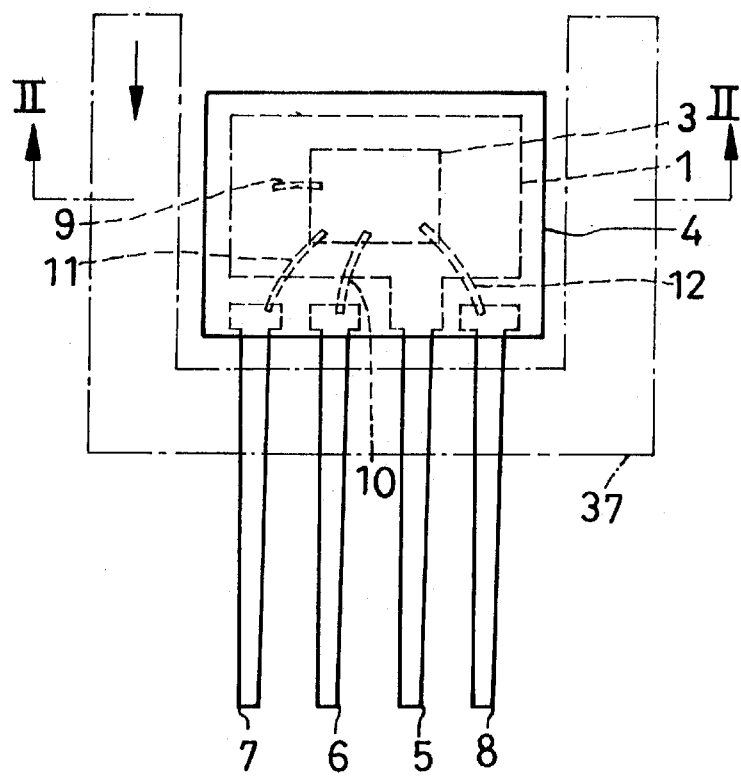
FIG. 1 is a plan view of a preferred form of magnetoelectric converter according to the present invention, the converter being shown together with the phantom outline of a conductor for carrying a current to be detected.
Figure 2:
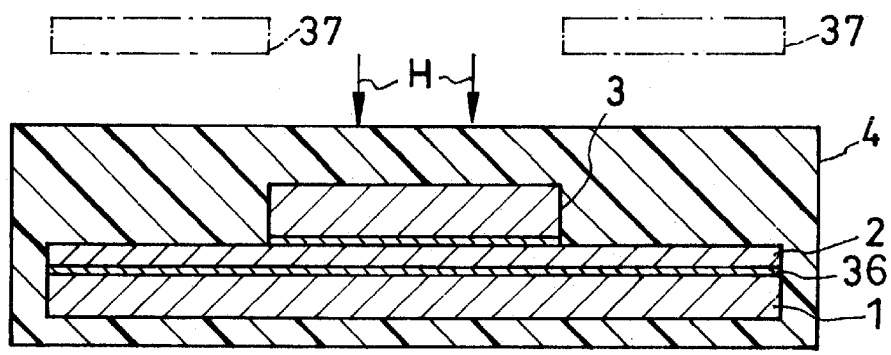
FIG. 2 is an enlarged section taken along the line II—II in FIG. 1.

The general configuration of the exemplified magnetoelectric converter according to the invention will be best understood from a consideration of FIGS. 1 and 2. Broadly, the converter comprises a metal-made baseplate 1, a magnetic layer 2 formed on one of the opposite major surfaces of the baseplate, semiconductor means 3 formed on the baseplate via the magnetic layer and including various working components of this converter, an encapsulation 4 of plastic or like insulating material thoroughly enclosing the semiconductor means together with the baseplate and the magnetic layer, a set of leads 5 to 8 extending through the encapsulation 4 for electrical connection of the converter to external circuitry, and lengths of wire 9 to 12 for electrically connecting the terminals of the semiconductor means 3 to the leads 5–8.

As will be noted also from FIGS. 1 and 2, the semiconductor means 3 as a whole are generally in the shape of a rather flat box and, as seen in a plan view as in FIG. 1, less in size or area than the baseplate 1 and the magnetic layer 2. The semiconductor means 3 are disposed centrally on the baseplate 1.

Figure 3:
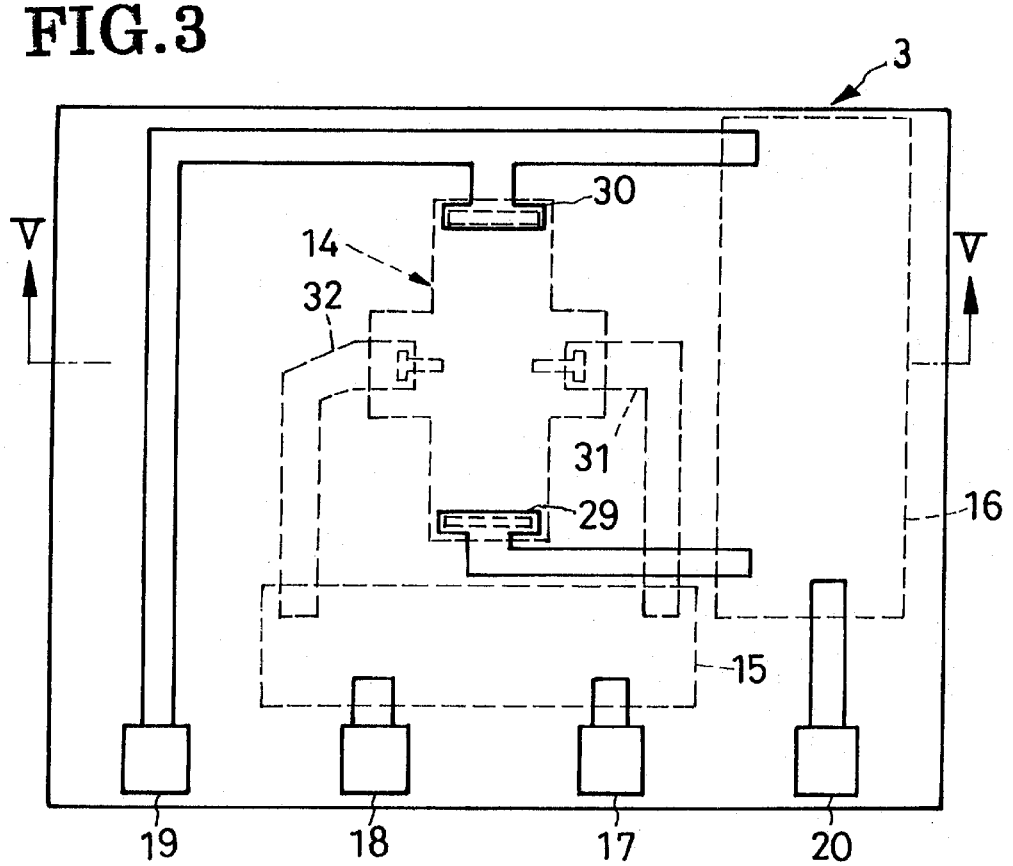
FIG. 3 is an enlarged plan view of the semiconductor means included in the FIG. 1 magnetoelectric converter.
Figure 4:
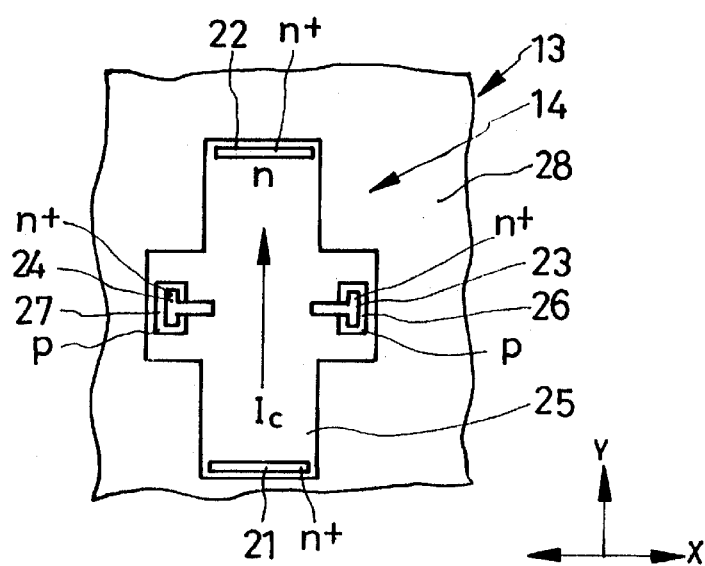
FIG. 4 is a fragmentary plan view similar to FIG. 3 but showing only the Hall-effect device included in the semiconductor means of the FIG. 1 magnetoelectric converter.
Figure 5:
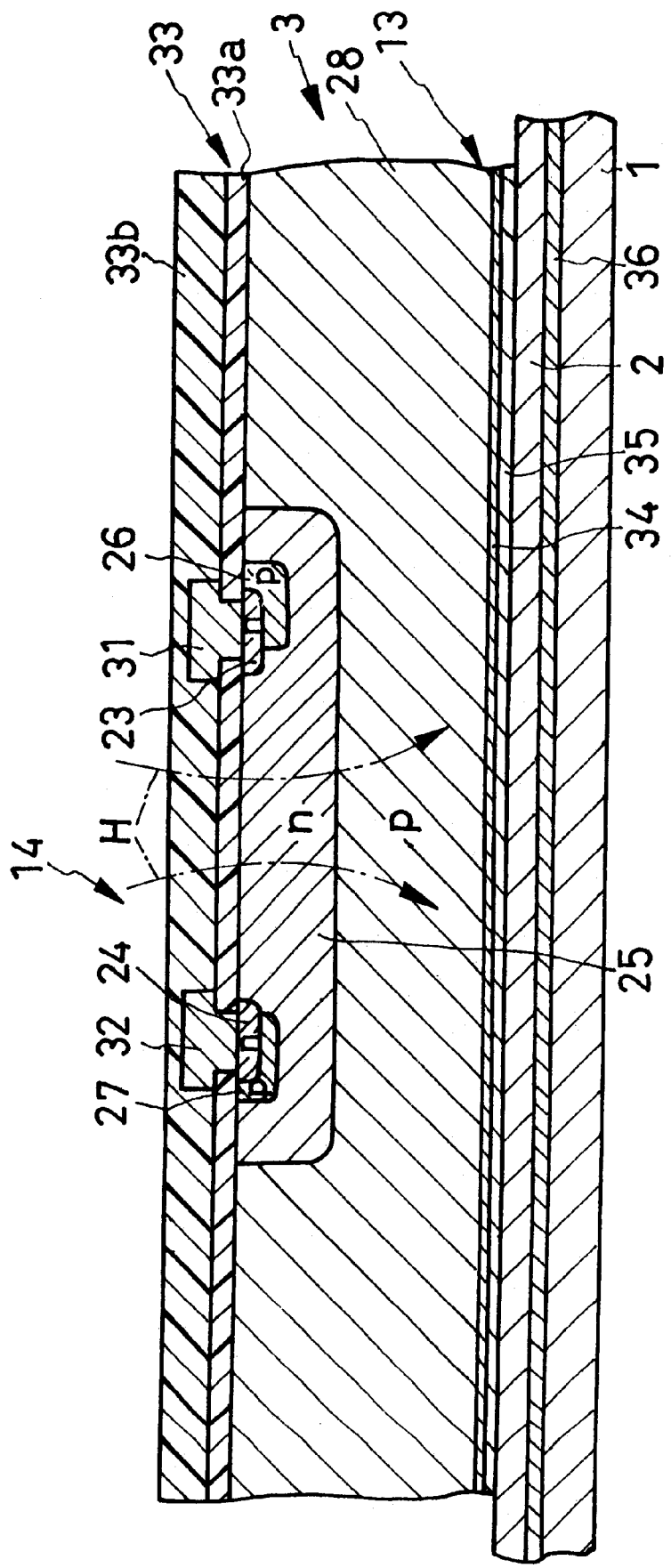
FIG. 5 is an enlarged, fragmentary section taken along the line V—V in FIG. 3 and showing the semiconductor means together with the metal-made baseplate and the magnetic layer thereon.

As depicted on an enlarged scale in FIGS. 3 and 4, and on a still more enlarged scale in FIG. 5, the semiconductor means 3 have a semiconductor substrate 13 in and on which is formed a Hall-effect device 14 as a primary working component of the converter. Other working components of the semiconductor means 3 include an output amplifier 15 and a control current supply circuit 16, both indicated in phantom outline in FIG. 3. A pair of output terminals 17 and 18 are connected to the output amplifier 15, and a pair of current supply terminals 19 and 20 to the control current supply circuit 16.

It is understood that the Hall-effect device 14, amplifier 15, and control current supply circuit 16 are all formed in one and the same substrate 13 of chemical compound semiconductor material (e.g. gallium arsenide), conjointly constituting the semiconductor means 3. Such semiconductor means 3 are of generally known construction and capable of fabrication by any known or suitable method. In FIGS. 4 and 5, therefore, only the Hall-effect device 14 is shown in detail by reason of its pertinence to the instant invention.

Referring more specifically to FIGS. 4 and 5, the semiconductor substrate 13 has formed therein five n-type semiconductor regions 21 to 25 and three p-type semiconductor regions 26 to 28. The first four n-type semiconductor regions 21 to 24 are all formed as islands in the fifth n-type semiconductor region 25 which is itself an island in the p-type semiconductor region 28 occupying most of the substrate 13.

As seen in a plan view as in FIG. 4, the fifth n-type semiconductor region 25 is shaped like a cross, with a limb extending along the y-axis being longer than the other limb extending along the x-axis. Both of $n^+$-type, that is, higher in impurity concentration than the fifth n-type semiconductor region 25, the first two n-type semiconductor regions 21 and 22 are formed adjacent the opposite ends of the y-axis limb of the cruciate fifth n-type semiconductor region.

FIG. 3 indicates that a pair of electrodes 29 and 30 are in ohmic contact with the opposed pair of $n^+$-type semiconductor regions 21 and 22, respectively. The pair of electrodes 29 and 30 are electrically connected to the control current supply circuit 16 and to the pair of current supply terminals 19 and 20. Therefore, as indicated by the arrow in FIG. 4, control current $I_C$ is to conventionally flow through the fifth n-type semiconductor region 25 from first $n^+$-type semiconductor region 21 to second $n^+$-type semiconductor region 22.

The third and fourth n-type semiconductor regions 23 and 24 are also higher in impurity concentration than the fifth n-type semiconductor region 25. These $n^+$-type regions 23 and 24 are formed adjacent the opposite ends of the x-axis limb of the cruciate fifth n-type semiconductor region 25. As will be better understood from FIG. 5, the second opposed pair of $n^+$-type semiconductor regions 23 and 24 are partly contiguous to the fifth n-type semiconductor region 25 and partly to the p-type semiconductor regions 26 and 27, respectively, which are formed like islands in the semiconductor region 25. The p-type semiconductor regions 26 and 27 are designed to limit the areas of contact of the second pair of $n^+$-type semiconductor regions 23 and 24 with the fifth n-type semiconductor region 25.

With reference back to FIG. 3 again, and as revealed in FIG. 5 too, another pair of electrodes 31 and 32 are provided in ohmic contact with the third and fourth n-type semiconductor regions 23 and 24, respectively. This second pair of electrodes 31 and 32 are both electrically connected to the output amplifier 15 and thence to the pair of output terminals 17 and 18.

With the flow of the control current $I_C$ between the first pair of $n^+$-type semiconductor regions 21 and 22, and upon application of a magnetic field at right angles with the control current $I_C$, a Hall voltage will develop between the second pair of $n^+$-type semiconductor regions 23 and 24 in accordance with the familiar Hall effect. The main working region of the Hall-effect device 14 for the development of the Hall voltage is therefore defined as that part of the fifth n-type semiconductor region 25 which lies between the first pair of $n^+$-type semiconductor regions 21 and 22 and between the second pair of $n^+$-type semiconductor regions 23 and 24. Speaking more broadly, however, the fifth n-type semiconductor region 25 as a whole may be considered the main working region.

As illustrated in FIG. 5, the semiconductor substrate 13 has an insulating film 33, as of silicon oxide, formed on its opposite surfaces in which is formed the Hall-effect device 14, and a metallic layer 34, as of aluminum, formed on the other surface. Preferably, and as shown, the insulating film 33 should be a lamination of two layers 33a and 33b in order to provide for multilayer wiring. The first pair of electrodes 29 and 30 may be connected to the first pair of $n^+$-type semiconductor regions 21 and 22 via windows, not shown, in both insulating layers 33a and 33b, and the second pair of electrodes 31 and 32 to the second pair of $n^+$-type semiconductor regions 23 and 24 via windows, also not shown, in the insulating layer 33a.

The metallic layer 34 on the other surface of the semiconductor substrate 13 is bonded to the magnetic layer 2 on the metal-made baseplate 1 via a layer 35 of either electrically conducting or insulating bonding material. The magnetic layer 2 comprises a magnetic material having a high magnetic permeability and a electrical conductivity. The magnetic permeability of the magnetic layer 2 is greater than the metal-made baseplate 1. The electrical conductivity of the magnetic layer 2 is less than the metal-made baseplate 1. Permalloy (tradename for any of several highly magnetically permeable iron-base alloys containing about 45–80% nickel) is a particularly recommended as a magnetic material for the magnetic layer 2. Preferably, the magnetic layer 2 of Permalloy or like material should have a specific permeability of about 5500 and a thickness of about 100 microns. The magnetic layer 2 is shown bonded to the baseplate 1 via a layer 36 of epoxy resin or like adhesive. (The adhesive layers 35 and 36 are both not shown in FIG. 2 for simplicity.)

As seen in a plan view as in FIGS. 1, 3 and 4, the magnetic layer 2 should be larger in size or area than the Hall-effect device 14. This objective is met in this particular embodiment as the magnetic layer 2 completely covers one of the major surfaces of the baseplate 1. The bonding of the magnetic layer 2 to the baseplate 1 is not a requirement. It may be otherwise formed in one piece with the baseplate, as by vapor deposition, compression, or fusion of a magnetic material.

With reference directed back to FIG. 1 the baseplate 1 and the four leads 5–8 can altogether take the form of a punching of sheet metal such as nickel-plated sheet copper. The baseplate 1 is electrically connected to the first terminal 17, FIG. 3, of the semiconductor means 3 by way of the wire 9. The lead 5 connected to the baseplate 1 is usually grounded. The other three terminals 18–20 of the semiconductor means 3 are connected to the leads 6–8 by way of the wires 10–12, respectively.

In use of the magnetoelectric converter of the foregoing construction for detection of current flowing through a U-shaped conductor indicated by the phantom outline and designated 37 in both FIGS. 1 and 2, the converter may be positioned contiguous to the conductor 37 as depicted in these figures. A magnetic field H will be created according to the Ampere rule in the direction of the arrows in both FIGS. 2 and 5 with current flow through the conductor 37. The magnetic field will act on the Hall-effect device 14 in three different directions. Since the direction of this magnetic field is at right angles with that of the flow of the control current $I_C$ through the fifth n-type semiconductor region 25, the Hall voltage will develop between the third and fourth n-type semiconductor regions 23 and 24, that is, between the third and fourth electrodes 31 and 32. The Hall voltage will be proportional to the strength of the magnetic field H, which in turn will be proportional to the magnitude of the current to be detected, so that this current will be detectable in terms of the Hall voltage.

In order to evaluate the effectiveness of the magnetic layer 2 constituting the gist of the instant invention in comparison with the prior art, there were fabricated a magnetoelectric converter of the same construction as that of the above described embodiment of the invention except for the absence of the magnetic layer 2. The sensitivities of this prior art converter of the FIGS. 1–5 construction were tested by causing current flow through the conductor 37. The tests proved that the converter according to the invention is 1.23 times as high in sensitivity as the prior art device.

The advantages gained by the foregoing embodiment of the invention may be recapitulated as follows:

1. Disposed contiguous to the semiconductor-substrate 13, the magnetic layer 2 serves to reduce the magnetic resistance of the flux path through the Hall-effect device 14, as well as to limit any unnecessary spreading of the flux, thereby contributing toward the higher sensitivity of the Hall-effect device.
2. The metal-made baseplate 1 and magnetic layer 2 coact to enhance the noise immunity of the Hall-effect device 14. Upon intrusion of relatively high-frequency electromagnetic wave or magnetic noise through the baseplate toward the Hall-effect device, eddy current will flow through the baseplate with the consequent absorption of the electromagnetic noise. If the noise is of such low frequency that no eddy current will flow through the baseplate, on the other hand, the magnetic layer 2 will provide a bypass and so prevents the noise from reaching the Hall-effect device.
3. The baseplate 1 serves the additional purpose of protecting the Hall-effect device from electric field noise.
4. The metal-made baseplate 1 and magnetic layer 2 improve the sensitivity and the noise without adding significantly to their manufacturing costs.

Figure 6:
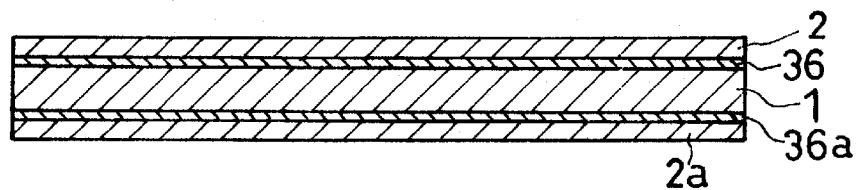
FIG. 6 is a sectional view somewhat similar to FIG. 2 and showing a metal-made baseplate together with two magnetic layers formed on its opposite surfaces by way of an alternative embodiment of this invention.

Despite the foregoing detailed disclosure the FIGS. 1–5 embodiment admits of some modifications. For example, as illustrated in FIG. 6, not only the magnetic layer 2 may be bonded at 36 to one surface of the baseplate 1, but another such layer 2a may be bonded at 36a to the other surface of the baseplate as well. Other possible modifications of the representative embodiment include:

1. The single magnetic layer 2 of FIG. 2 could be formed on the underside, as seen in this figure, of the baseplate 1, and the semiconductor means 3 could be formed on the baseplate without interposition of a magnetic layer.
2. The magnetic layer 2 could be of such highly permeable material as ferrite.
3. The baseplate 1 could be of such highly conductive metal as aluminum.
4. The amplifier 15 and control current supply circuit 16 could not be integrally incorporated in the semiconductor means 3.
5. The current path conductor 37 could be incorporated in the magnetoelectric converter.

All these and other modifications, alterations and adaptations of the illustrated embodiments are intended in the foregoing disclosure. It is therefore appropriate that the present invention be construed broadly and in a manner consistent with the fair meaning or proper scope of the subjoined claims.

What is claimed is:

1. An apparatus for detecting an electric current, comprising:
   (a) a metal-made baseplate having a known magnetic permeability and a known electrical conductivity;
   (b) a magnetic layer formed on the baseplate, the magnetic layer being higher in magnetic permeability than the baseplate;
   (c) semiconductor means mounted to the baseplate, the semiconductor means including a Hall-effect device for generating a voltage proportional to the strength of an applied magnetic field;
   (d) an encapsulation of electrically insulating material enveloping the baseplate and the magnetic layer and the semiconductor means; and
   (e) a conductor for carrying current to be detected, the conductor being disposed contiguous the Hall-effect device in order to cause the Hall-effect device to generate the Hall voltage in response to a magnetic field due to the current flowing through the conductor, and the conductor being disposed opposite the magnetic layer via the Hall-effect device.

2. The apparatus of claim 1 wherein the magnetic layer is of Permalloy.

3. The apparatus of claim 2 wherein the baseplate is of copper.

4. The apparatus of claim 3 wherein the baseplate has a nickel plating.

5. The apparatus of claim 1 wherein the magnetic layer is formed on one of a pair of opposite major surfaces of the baseplate, and wherein the semiconductor means is mounted to the baseplate via the magnetic layer.

6. The apparatus of claim 1 wherein the magnetic layer is formed on one of a pair of opposite major surfaces of the baseplate, and wherein another similar magnetic layer is formed on the other major surface of the baseplate.

\* \* \* \* \*